(12) United States Patent
Vorndran

(10) Patent No.: US 11,761,986 B2
(45) Date of Patent: Sep. 19, 2023

(54) RADIATION HARDENED CURRENT SENSOR WITH ACTIVE FILTER

(71) Applicant: Hamilton Sundstrand Corporation, Charlotte, NC (US)

(72) Inventor: John Vorndran, Roscoe, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 47 days.

(21) Appl. No.: 17/494,437

(22) Filed: Oct. 5, 2021

(65) Prior Publication Data

US 2023/0109636 A1 Apr. 6, 2023

(51) Int. Cl.
- *G01R 15/14* (2006.01)
- *G01R 15/18* (2006.01)
- *H03K 5/24* (2006.01)

(52) U.S. Cl.
CPC ......... *G01R 15/142* (2013.01); *G01R 15/183* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 4,977,374 A | 12/1990 | Kleiner | |
| 5,811,965 A | 9/1998 | Gu | |
| 5,814,983 A | 9/1998 | Shum | |
| 7,839,605 B2 | 11/2010 | Parker | |
| 10,481,186 B2 | 11/2019 | Keister et al. | |
| 10,666,280 B2 | 5/2020 | Lee et al. | |
| 10,797,701 B2 | 10/2020 | Zubkow et al. | |
| 2009/0108833 A1* | 4/2009 | Ziegler | G01R 15/185 324/117 R |
| 2019/0319632 A1* | 10/2019 | Lee | H03M 1/0607 |
| 2023/0012403 A1* | 1/2023 | Archer | H05B 45/14 |

FOREIGN PATENT DOCUMENTS

| | | |
|---|---|---|
| EP | 0356248 A1 | 2/1990 |
| EP | 2648300 A1 | 10/2013 |
| EP | 3315984 A1 | 5/2018 |
| EP | 3608678 A1 | 2/2020 |

OTHER PUBLICATIONS

Search Report issued for European Patent Application No. 22199648.1; Application filed Oct. 4, 2022; dated Mar. 21, 2023 (8 pages).

* cited by examiner

*Primary Examiner* — Douglas X Rodriguez
(74) *Attorney, Agent, or Firm* — CANTOR COLBURN LLP

(57) ABSTRACT

A radiation hardened current sensor to sense direct current (DC), low frequency alternating current (AC), and high frequency AC includes a DC current transformer (DCCT) including a primary DCCT winding and a secondary DCCT winding. A self-oscillating modulator is coupled to the secondary DCCT winding of the DCCT to maintain a magnetic flux density of the DCCT at an upper limit and a lower limit of a magnetic hysteresis characteristic of the DCCT. An active filter passes only the DC and the low frequency AC from the DCCT as an output. An AC current transformer (ACCT) including a primary ACCT winding and a secondary ACCT winding. The output of the active filter is coupled to the ACCT and the secondary ACCT winding provides the high frequency AC.

11 Claims, 1 Drawing Sheet

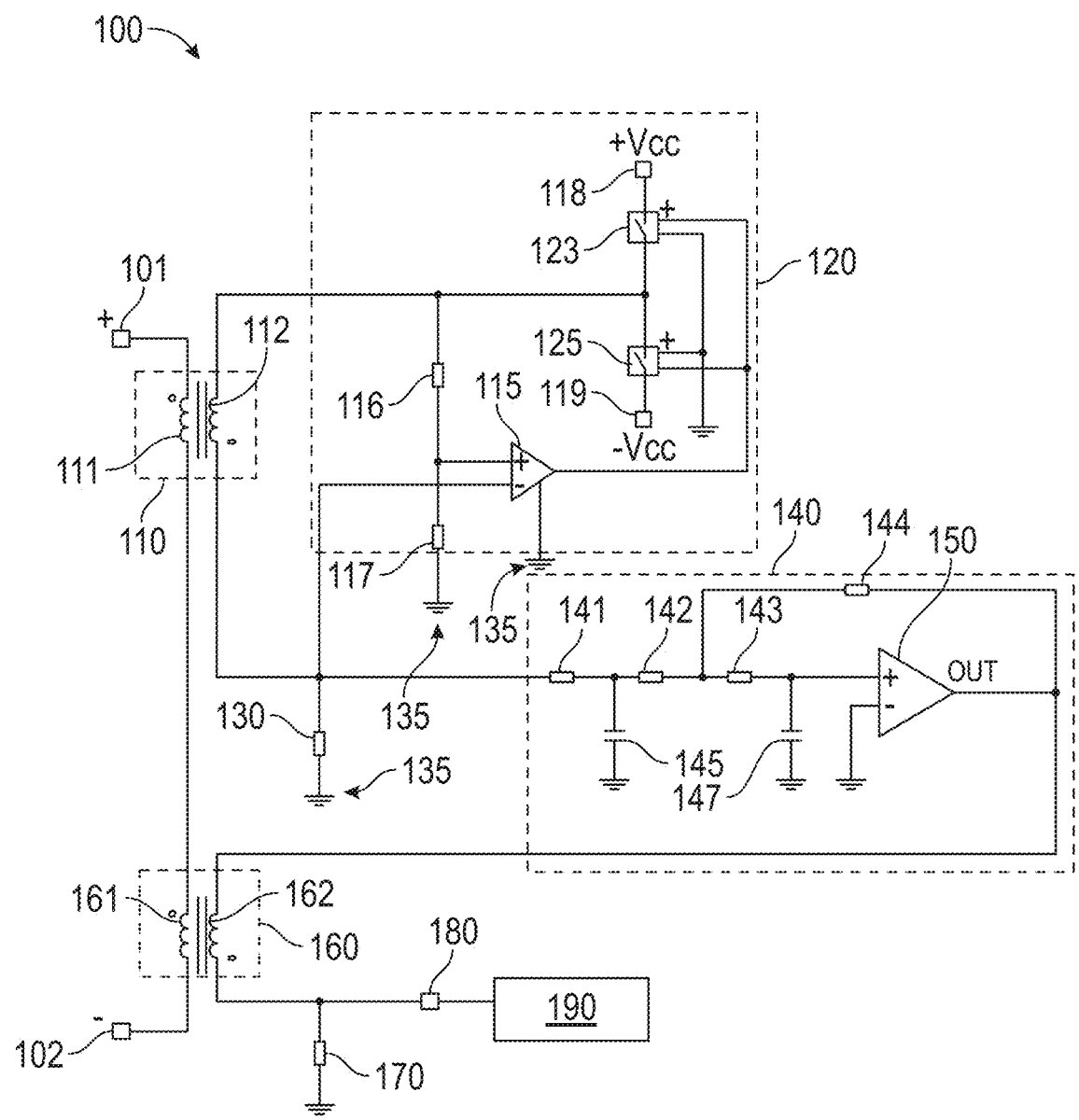

RADIATION HARDENED CURRENT SENSOR WITH ACTIVE FILTER

BACKGROUND

Exemplary embodiments pertain to the art of current sensors and, in particular, to a radiation hardened current sensor with an active filter.

Current sensing may be performed in many systems for a variety of reasons. For example, sensed current may be used as a feedback signal or current may simply be monitored at one or more points in the system. When a system that requires current sensing is exposed to radiation, the radiation may make the use of certain components impractical. For example, in space applications, the electronics are subject to radiation. The radiation may result from protons and electrons trapped near the Earth's surface, solar particles, or galactic cosmic rays that are generally filtered by the earth's atmosphere and, thus, are not a concern in terrestrial applications. Thus, current sensing in space-based electronics cannot employ conventional components.

BRIEF DESCRIPTION

In one exemplary embodiment, a radiation hardened current sensor to sense direct current (DC), low frequency alternating current (AC), and high frequency AC includes a DC current transformer (DCCT) including a primary DCCT winding and a secondary DCCT winding. A self-oscillating modulator coupled to the secondary DCCT winding of the DCCT maintains a magnetic flux density of the DCCT at an upper limit and a lower limit of a magnetic hysteresis characteristic of the DCCT. An active filter passes only the DC and the low frequency AC from the DCCT as an output. An AC current transformer (ACCT) includes a primary ACCT winding and a secondary ACCT winding. The output of the active filter is coupled to the ACCT and the secondary ACCT winding provides the high frequency AC.

In addition to one or more of the features described herein, the current sensor also includes input terminals to couple to a conductor through which current being sensed flows.

In addition to one or more of the features described herein, the current being sensed flows through the input terminal and the primary DCCT winding and the primary ACCT winding.

In addition to one or more of the features described herein, the output of the active filter is coupled to the secondary ACCT winding of the ACCT.

In addition to one or more of the features described herein, turns of the primary ACCT winding are in an opposite direction to turns of the secondary ACCT winding such that the DC and the low frequency AC in the output of the active filter counteract DC and low frequency AC components of the current being sensed that are induced in the secondary ACCT winding from the primary ACCT winding.

In addition to one or more of the features described herein, the current sensor also includes an output terminal coupled to the secondary ACCT winding. A high frequency AC component of the current being sensed is obtained at the output terminal by dividing the high frequency AC through the secondary ACCT winding by a ratio of turns of the primary ACCT winding to turns of the secondary ACCT winding.

In addition to one or more of the features described herein, DC and low frequency AC components of the current being sensed are the DC and the low frequency AC provided as the output of the active filter divided by a ratio of turns of the primary DCCT winding to turns of the secondary ACCT winding.

In addition to one or more of the features described herein, the self-oscillating modulator includes a comparator configured to control a first switch and a second switch.

In addition to one or more of the features described herein, the comparator closes the first switch that controls a supply of a positive voltage and opens the second switch that controls a supply of a negative voltage until the DCCT exceeds the upper limit of the magnetic hysteresis characteristic.

In addition to one or more of the features described herein, the comparator opens the first switch and closes the second switch after the DCCT exceeds the upper limit of the magnetic hysteresis characteristic until the DCCT exceeds the lower limit of the magnetic hysteresis characteristic.

In another exemplary embodiment, a method of assembling a radiation hardened current sensor to sense direct current (DC), low frequency alternating current (AC), and high frequency AC includes arranging a DC current transformer (DCCT) including a primary DCCT winding and a secondary DCCT winding, coupling a self-oscillating modulator to the secondary DCCT winding of the DCCT, and configuring the self-oscillating modulator to maintain a magnetic flux density of the DCCT at an upper limit and a lower limit of a magnetic hysteresis characteristic of the DCCT. An active filter is arranged to pass only the DC and the low frequency AC from the DCCT as an output. An AC current transformer (ACCT) including a primary ACCT winding and a secondary ACCT winding is arranged such that the output of the active filter is coupled to the ACCT and the secondary ACCT winding provides the high frequency AC.

In addition to one or more of the features described herein, the method also includes configuring input terminals to couple to a conductor through which current being sensed flows.

In addition to one or more of the features described herein, the arranging the DCCT and the ACCT is such that current being sensed flows through the input terminal and the primary DCCT winding and the primary ACCT winding.

In addition to one or more of the features described herein, the method also includes coupling the output of the active filter to the secondary ACCT winding of the ACCT.

In addition to one or more of the features described herein, the arranging the ACCT includes arranging turns of the primary ACCT winding in an opposite direction to turns of the secondary ACCT winding such that the DC and the low frequency AC in the output of the active filter counteract DC and low frequency AC components of the current being sensed that are induced in the secondary ACCT winding from the primary ACCT winding.

In addition to one or more of the features described herein, the method also includes coupling an output terminal to the secondary ACCT winding, wherein a high frequency AC component of the current being sensed is obtained at the output terminal by dividing the high frequency AC through the secondary ACCT winding by a ratio of turns of the primary ACCT winding to turns of the secondary ACCT winding.

In addition to one or more of the features described herein, the method also includes obtaining DC and low frequency AC components of the current being sensed as the DC and the low frequency AC provided as the output of the active filter divided by a ratio of turns of the primary DCCT winding to turns of the secondary ACCT winding.

In addition to one or more of the features described herein, the method also includes configuring the self-oscillating modulator to include a comparator to control a first switch and a second switch.

In addition to one or more of the features described herein, the method also includes configuring the comparator to close the first switch that controls a supply of a positive voltage and open the second switch that controls a supply of a negative voltage until the DCCT exceeds the upper limit of the magnetic hysteresis characteristic.

In addition to one or more of the features described herein, the configuring the comparator includes the comparator opening the first switch and closing the second switch after the DCCT exceeds the upper limit of the magnetic hysteresis characteristic until the DCCT exceeds the lower limit of the magnetic hysteresis characteristic.

BRIEF DESCRIPTION OF THE DRAWINGS

The following descriptions should not be considered limiting in any way.

FIG. 1 is a circuit diagram of a radiation hardened current sensor with an active filter according to one or more embodiments.

DETAILED DESCRIPTION

A detailed description of one or more embodiments of the disclosed apparatus and method are presented herein by way of exemplification and not limitation with reference to the Figures.

As previously noted, current sensing may be performed in many systems for a number of reasons. When a system requiring current sensing is used in an environment (e.g., space) in which it is subjected to radiation, a conventional current sensor may be impractical. This is because producing radiation hardened versions of some of the components needed in conventional current sensors may be difficult and expensive. For example, a Hall effect sensor that detects the presence and magnitude of a magnetic field based on changing voltage, uses components that are sensitive to radiation and not easily fabricated as radiation hardened versions.

Embodiments of the systems and methods detailed herein relate to a radiation hardened current sensor with an active filter. In particular, a magnetic approach is used with an active filter. All of the components used in the current sensor may be radiation hardened. An exemplary application may require sensing motor drive current in a thrust vector controller of a space vehicle. The exemplary application requires a robust current sensor that senses current from direct current (DC) (i.e., zero frequency) to alternating current (AC) with a frequency up to 10 megahertz (MHz). As detailed, the current sensor according to one or more embodiments includes a DC current transformer (DCCT) used to sense DC and low frequency AC current, which is passed by an active filter to an AC current transformer (ACCT) used to sense higher frequency AC current.

FIG. 1 is a circuit diagram of a radiation hardened current sensor 100 with an active filter 140 according to one or more embodiments. The input terminals 101 and 102 of the current sensor 100 are electrically coupled to a conductor in which the current of interest is flowing (e.g., winding of motor in thrust vector controller of a space vehicle) in order to implement the bi-directional current sensing. The current sensor 100 includes a DCCT 110, the active filter 140, and an ACCT 160. The DCCT 110 includes a primary winding 111 and secondary winding 112. The ACCT 160 includes a primary winding 161 and a secondary winding 162. The active filter 140 includes resistors 141, 142, 143, 144, capacitors 145, 147, and an operational amplifier 150. Additional components include resistors 116, 117, 130, 170, a comparator 115, voltage supply terminals 118 (+Vcc) and 119 (−Vcc), switches 123, 125, and the output terminal 180. The reference or ground terminal 135 may be a common location or locations that are connected to a common reference potential. As detailed, the current sensor 100 is configured to sense current across the input terminals 101, 102 over a range of frequencies from DC to several MHz and is configured to perform accurately in an environment that is subjected to radiation. As shown in the FIGURE, current to be sensed (i.e., through input terminals 101, 102) flows across the primary windings 111, 161 of the DCCT 110 and the ACCT 160.

The DCCT 110 is used to sense current having both DC and (low frequency) AC components. Generally, a transformer (110, 160) has a magnetic core and windings 111, 112 and 161, 162. A current is induced through the secondary winding (112, 162) when current flows through the primary winding (111, 161). The current through the secondary winding (112, 162) is proportional to the current through the primary winding (111, 161). The DCCT 110 facilitates inducing DC, as well as low frequency AC, at the secondary winding 112 that is proportional to DC through the primary winding 111. This is typically not possible and is facilitated in the DCCT 110 based on exciting the secondary winding 112 using the voltage supply terminals 118 (+Vcc) and 119 (−Vcc) and the switches 123, 125.

Specifically, the comparator 115 is part of a self-oscillating modulator 120. A ratio of the resistors 116, 117 is used to set a limit that is checked by the comparator 115. This (positive and negative) limit is based on the highest expected (positive and negative) flux density (e.g., if the highest expected motor drive current is 10 amperes (A), the limit may be set corresponding to +/−11 A). The switches 123, 125 operate to keep the magnetic flux density of the DCCT 110 switching between the upper and lower limits of its magnetic hysteresis characteristic (e.g., between +1 Tesla (T) and −1 T). That is, when the switch 123 is closed (with switch 125 open), +Vcc is supplied and the current through the DCCT 110 increases until the comparator 115 determines that the (positive) limit has been reached. The comparator 115 then controls the switches 123, 125 such that the switch 125 is closed (switch 123 is opened) to supply −Vcc until the comparator 115 determines that current through the DCCT 110 has reached the (negative) limit. This pattern is repeated. When this oscillation condition is reached at the core of the DCCT 110 (i.e., when the magnetic flux density is controlled to switch between the upper and lower limit, such as between +1 T and −1 T), the current through the resistor 130 will be the current that flows through the secondary winding 112 of the DCCT 110. The DC and low frequency AC that flows through the primary winding 111 may then be determined by dividing the current through the resistor 130 (i.e., through the secondary winding 112) by the ratio of turns of the primary winding 111 to the turns of the secondary winding 112.

The active filter 140 provides a correction to the ACCT 160. The active filter 140 passes only the DC and low frequency AC of interest by implementing a transfer function that is flat through the DC and low frequency AC frequencies of interest (e.g., 0 to 10 kilohertz (KHz)). That is, the active filter 140 clips the current spikes resulting from the (positive and negative) limits set at the comparator 115. As shown in the FIGURE, the output of the active filter 140 is provided to the secondary winding 162 of the ACCT 160 that is wound in the opposite direction as the primary winding 161. This is unlike the DCCT 110, in which the primary winding 111 and secondary winding 112 are wound in the same direction. As a result of the active filter 140 providing DC and low frequency AC to the secondary winding 162 (wound in the opposite direction as the primary winding 161), the effect of the DC and low frequency AC through the primary winding 161 on the magnetic field of the ACCT 160 is counteracted.

That is, the portion of the sensed current (i.e., the DC and low frequency AC) that would force the magnetic flux density of the ACCT 160 to the upper and lower limits of its magnetic hysteresis is eliminated. This leaves the portion of the sensed current (i.e., higher frequency AC) that keeps the magnetic flux density in the linear part of its hysteresis. As a result, the current through the secondary winding 162 is proportional to the higher frequency AC (e.g., 1 KHz to 10 KHz) in the primary winding 161 of the ACCT 160. This current is output via output terminal 180 to a component 190. The component 190 may be an analog-to-digital converter (ADC) or a microprocessor, for example. The higher frequency AC through the primary winding 161 may be determined by the component 190 or by processing circuitry supplied by the component 190 as the current at the output terminal (i.e., current through the secondary winding 162) divided by the ratio of turns in the primary winding 161 to the turns in the secondary winding 162.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A radiation hardened current sensor to sense direct current (DC), low frequency alternating current (AC), and high frequency AC, the current sensor comprising:
   a DC current transformer (DCCT) comprising a primary DCCT winding and a secondary DCCT winding;
   a self-oscillating modulator coupled to the secondary DCCT winding of the DCCT and configured to maintain a magnetic flux density of the DCCT at an upper limit and a lower limit of a magnetic hysteresis characteristic of the DCCT;
   an active filter configured to pass only the DC and the low frequency AC from the DCCT as an output;
   an AC current transformer (ACCT) comprising a primary ACCT winding and a secondary ACCT winding, wherein the output of the active filter is coupled to the ACCT and the secondary ACCT winding provides the high frequency AC;
   input terminals configured to couple to a conductor through which current being sensed flows;
   wherein the current being sensed flows through the input terminal and the primary DCCT winding and the primary ACCT winding;
   wherein the output of the active filter is coupled to the secondary ACCT winding of the ACCT;
   wherein turns of the primary ACCT winding are in an opposite direction to turns of the secondary ACCT winding such that the DC and the low frequency AC in the output of the active filter counteract DC and low frequency AC components of the current being sensed that are induced in the secondary ACCT winding from the primary ACCT winding.

2. The current sensor according to claim 1, further comprising an output terminal coupled to the secondary ACCT winding, wherein a high frequency AC component of the current being sensed is obtained at the output terminal by dividing the high frequency AC through the secondary ACCT winding by a ratio of turns of the primary ACCT winding to turns of the secondary ACCT winding.

3. A radiation hardened current sensor to sense direct current (DC), low frequency alternating current (AC), and high frequency AC, the current sensor comprising:
   a DC current transformer (DCCT) comprising a primary DCCT winding and a secondary DCCT winding;
   a self-oscillating modulator coupled to the secondary DCCT winding of the DCCT and configured to maintain a magnetic flux density of the DCCT at an upper limit and a lower limit of a magnetic hysteresis characteristic of the DCCT;
   an active filter configured to pass only the DC and the low frequency AC from the DCCT as an output;
   an AC current transformer (ACCT) comprising a primary ACCT winding and a secondary ACCT winding, wherein the output of the active filter is coupled to the ACCT and the secondary ACCT winding provides the high frequency AC; and
   input terminals configured to couple to a conductor through which current being sensed flows;
   wherein the current being sensed flows through the input terminal and the primary DCCT winding and the primary ACCT winding;
   wherein DC and low frequency AC components of the current being sensed are the DC and the low frequency AC provided as the output of the active filter divided by a ratio of turns of the primary DCCT winding to turns of the secondary ACCT winding.

4. A radiation hardened current sensor to sense direct current (DC), low frequency alternating current (AC), and high frequency AC, the current sensor comprising:
   a DC current transformer (DCCT) comprising a primary DCCT winding and a secondary DCCT winding;
   a self-oscillating modulator coupled to the secondary DCCT winding of the DCCT and configured to maintain a magnetic flux density of the DCCT at an upper limit and a lower limit of a magnetic hysteresis characteristic of the DCCT;
   an active filter configured to pass only the DC and the low frequency AC from the DCCT as an output;

an AC current transformer (ACCT) comprising a primary ACCT winding and a secondary ACCT winding, wherein the output of the active filter is coupled to the ACCT and the secondary ACCT winding provides the high frequency AC;

wherein the self-oscillating modulator includes a comparator configured to control a first switch and a second switch;

wherein the comparator closes the first switch that controls a supply of a positive voltage and opens the second switch that controls a supply of a negative voltage until the DCCT exceeds the upper limit of the magnetic hysteresis characteristic.

5. The current sensor according to claim 4, wherein the comparator opens the first switch and closes the second switch after the DCCT exceeds the upper limit of the magnetic hysteresis characteristic until the DCCT exceeds the lower limit of the magnetic hysteresis characteristic.

6. A method of assembling a radiation hardened current sensor to sense direct current (DC), low frequency alternating current (AC), and high frequency AC, the method comprising:

arranging a DC current transformer (DCCT) including a primary DCCT winding and a secondary DCCT winding;

coupling a self-oscillating modulator to the secondary DCCT winding of the DCCT;

configuring the self-oscillating modulator to maintain a magnetic flux density of the DCCT at an upper limit and a lower limit of a magnetic hysteresis characteristic of the DCCT;

arranging an active filter to pass only the DC and the low frequency AC from the DCCT as an output; and arranging an AC current transformer (ACCT) including a primary ACCT winding and a secondary ACCT winding such that the output of the active filter is coupled to the ACCT and the secondary ACCT winding provides the high frequency AC;

configuring input terminals to couple to a conductor through which current being sensed flows, wherein the arranging the DCCT and the ACCT is such that current being sensed flows through the input terminal and the primary DCCT winding and the primary ACCT winding; and obtaining DC and low frequency AC components of the current being sensed as the DC and the low frequency AC provided as the output of the active filter divided by a ratio of turns of the primary DCCT winding to turns of the secondary ACCT winding.

7. The method according to claim 6, further comprising coupling the output of the active filter to the secondary ACCT winding of the ACCT.

8. The method according to claim 7, wherein the arranging the ACCT includes arranging turns of the primary ACCT winding in an opposite direction to turns of the secondary ACCT winding such that the DC and the low frequency AC in the output of the active filter counteract DC and low frequency AC components of the current being sensed that are induced in the secondary ACCT winding from the primary ACCT winding.

9. The method according to claim 8, further comprising coupling an output terminal to the secondary ACCT winding, wherein a high frequency AC component of the current being sensed is obtained at the output terminal by dividing the high frequency AC through the secondary ACCT winding by a ratio of turns of the primary ACCT winding to turns of the secondary ACCT winding.

10. A method of assembling a radiation hardened current sensor to sense direct current (DC), low frequency alternating current (AC), and high frequency AC, the method comprising:

arranging a DC current transformer (DCCT) including a primary DCCT winding and a secondary DCCT winding;

coupling a self-oscillating modulator to the secondary DCCT winding of the DCCT;

configuring the self-oscillating modulator to maintain a magnetic flux density of the DCCT at an upper limit and a lower limit of a magnetic hysteresis characteristic of the DCCT;

arranging an active filter to pass only the DC and the low frequency AC from the DCCT as an output;

arranging an AC current transformer (ACCT) including a primary ACCT winding and a secondary ACCT winding such that the output of the active filter is coupled to the ACCT and the secondary ACCT winding provides the high frequency AC;

configuring the self-oscillating modulator to include a comparator to control a first switch and a second switch; and configuring the comparator to close the first switch that controls a supply of a positive voltage and open the second switch that controls a supply of a negative voltage until the DCCT exceeds the upper limit of the magnetic hysteresis characteristic.

11. The method according to claim 10, wherein the configuring the comparator includes the comparator opening the first switch and closing the second switch after the DCCT exceeds the upper limit of the magnetic hysteresis characteristic until the DCCT exceeds the lower limit of the magnetic hysteresis characteristic.

* * * * *